United States Patent [19]

Whight

[11] Patent Number: 4,920,064

[45] Date of Patent: Apr. 24, 1990

[54] METHOD OF MANUFACTURING AN INSULATED GATE FIELD EFFECT TRANSISTOR DMOS

[75] Inventor: Kenneth R. Whight, Cowfold, England

[73] Assignee: U.S. Philips Corporation, New York, N.Y.

[21] Appl. No.: 339,939

[22] Filed: Apr. 18, 1989

Related U.S. Application Data

[63] Continuation of Ser. No. 68,599, Jun. 30, 1987, abandoned.

[30] Foreign Application Priority Data

Aug. 8, 1986 [GB] United Kingdom ............. 8619426
Dec. 20, 1986 [GB] United Kingdom ............. 8630814

[51] Int. Cl.$^5$ ............... H01L 21/312; H01L 21/283
[52] U.S. Cl. ............................. 437/41; 437/203; 437/229; 437/38; 148/DIG. 106; 148/DIG. 126
[58] Field of Search ............. 437/38, 40, 41, 48, 437/203, 202, 229, 149, 228, 157, 27, 31, 48; 148/DIG. 43, DIG. 82, DIG. 106, DIG. 126, DIG. 140; 357/23.4; 156/653, 657, 659.1

[56] References Cited

U.S. PATENT DOCUMENTS

| | | | |
|---|---|---|---|
| 4,021,270 | 5/1977 | Hunt et al. | 437/44 |
| 4,182,636 | 1/1980 | Dennard et al. | 437/41 |
| 4,466,176 | 8/1984 | Temple | 437/203 |
| 4,503,598 | 3/1985 | Vora et al. | 437/203 |
| 4,567,641 | 2/1986 | Baliga et al. | 437/41 |
| 4,598,461 | 7/1986 | Love | 437/41 |
| 4,632,724 | 12/1986 | Chesebro et al. | 156/626 |
| 4,648,174 | 3/1987 | Temple et al. | 437/203 |
| 4,692,998 | 9/1987 | Armstrong et al. | 437/225 |

FOREIGN PATENT DOCUMENTS

| | | |
|---|---|---|
| 0038994 | 4/1981 | European Pat. Off. |
| 3402867 | 8/1985 | Fed. Rep. of Germany |
| 0067475 | 6/1981 | United Kingdom |

Primary Examiner—Brian E. Hearn
Assistant Examiner—T. N. Quach
Attorney, Agent, or Firm—Paul R. Miller

[57] ABSTRACT

A method of manufacturing an insulated gate field effect transistor is described. The method comprises providing a gate layer (6) on an insulating layer (12) on one surface (4) of a semiconductor body (1) and source regions (2) of one conductivity type within a respective body region (14), a portion of each body region (14) underlying a portion of the gate layer to provide a channel area extending between the source region (2) and a drain region (3) meeting another surface (5) of the semiconductor body opposite the one surface (4). Each source region (2) is shorted to the corresponding body region (14) by opening a contact window (15) in the insulating layer on the one surface so as to expose a surface of the source region (2), providing resist masking regions (16) extending completely across the contact window in one direction so as to define an exposed area of the source region which is not covered by either the masking regions or the insulating layer (12), and has a periphery defined partly by the contact window and partly by the masking region(s), etching away the exposed area of the source region (2) to expose an underlying area of the body region (14), removing the masking regions and providing metallization within the contact window (15) to short the exposed area of the body region to the source region.

17 Claims, 4 Drawing Sheets

METHOD OF MANUFACTURING AN INSULATED GATE FIELD EFFECT TRANSISTOR DMOS

This is a continuation of application Ser. No. 068,599, filed June 30, 1987 now abandoned.

This invention relates to a method of manufacturing an insulated gate field effect transistor (IGFET), in particular an IGFET such as an interdigitated vertical DMOS transistor for high frequency power applications.

As is understood in the art, the term vertical configuration is applied to an IGFET in which the source and drain electrodes are disposed on opposite major surfaces of the semiconductor body, although the gate and channel area may extend laterally or horizontally at one of the said major surfaces. The term DMOS is understood in the art to apply to an IGFET in which the channel length is accurately defined by double lateral diffusion of different impurities which enables accurately determined short length channels to be produced which is particularly advantageous for high frequency applications.

A known method of manufacturing an insulated gate field effect transistor comprises providing a gate layer on an insulating layer on one surface of a semiconductor body so that the gate layer has a plurality of regularly arranged openings therein, introducing impurities into the semiconductor body so as to provide a plurality of source regions of one conductivity type in the body, each source region lying inside a respective opening of the gate layer and being provided within a respective body region of the opposite conductivity type, a portion of each body region underlying a respective portion of the gate layer so as to provide a respective channel area extending between the respective source region and a or a respective drain region of the one conductivity type and shorting each source region to the corresponding body region.

In the previously proposed such method described in European Patent No. EP-A-67475, corresponding to U.S. Pat. No. 4,466,175 the source and body regions are formed by implantation of appropriate opposite type impurities through a thermally grown oxide layer on the surface of the semiconductor body using a previously defined gate layer as a mask. After implantation of the appropriate impurities to form the body regions, the surface of the oxide layer within each opening of the gate layer is masked with an appropriate resist pattern prior to carrying out a second implanting step to form the source regions. The resist masking is of a sufficient thickness that it masks the underlying areas from the subsequent second implanting step so that, after the second implanting step to form the source regions, both source and body region areas meet or reach the surface of the semiconductor body within each gate layer opening. A respective contact window is then opened in the oxide within each gate layer opening so that later deposition of source metallisation within the contact windows shorts the source and body regions as required particularly for high frequency operation to prevent parasitic bipolar action within the IGFET.

Such a known method has various disadvantages. In particular, it is found in practice that the heavy implantation step required to form the source regions tends to burn the resist onto the surface making it difficult to remove. Also, the known method relies heavily on very precise alignment of the resist mask used to produce the source and body region areas to be shorted together by deposition of the source metallisation. Also, misalignment between the contact windows and the resist pattern may occur so that, for example, a contact window may be displaced sideways with respect to the exposed surface areas of the body region or the row or series of alternate body and source region areas may be at an angle to the contact window. Such misalignment problems make it difficult to produce devices in quantity with reproducible operating characteristics because, for example, if such misalignment occurs the source resistance may vary across the source regions. This is a particular problem if the IGFET is to be used in current source mode as the source resistance provides feedback which affects the gain of the device and variations in source resistance between devices will produce corresponding variations in gain.

Also such misalignment causes variability in the quality and resistance of the contact to the body regions making the use of larger exposed surface areas of the body regions necessary in order to ensure reliable contact so increasing the size of the device. Furthermore, for high frequency applications where gold contacts are to be used, it is necessary to dope up the surface of the body region areas which doping requires an additional masking and an implantation step and so introduces a further alignment tolerance problem. The necessity for such additional doping means that with the known method described above, the size of the body region areas meeting the surface has to be increased to ensure contact is made to the body region areas when the source metallisation is deposited. This increases the overall device size and also increases parasitic capacitance problems.

A method of shorting a source region to the surrounding body region is known, such as corresponding to European Patent No. EP-A-38994, in which the entire surface exposed by the contact window is exposed to impurities to form a highly doped n+ type auxiliary region at the exposed surface and then a contact aperture is formed, using photolithographic and etching techniques, through the exposed surface to expose an area of the body region for shorting to the source region with the exposed area of the body region being completely surrounded by the highly doped auxiliary region. Although this method may avoid burning of the resist onto the surface by implanting the impurities to form the highly doped auxiliary region prior to providing the photoresist mask, it still requires precise alignment of the photoresist mask and contact window opened in the oxide layer and, as indicated above, misalignment may occur resulting in the exposed surface area of the body region being misaligned with the contact window.

Another method of shorting a source region to the surrounding body region is known, such as corresponding to European Patent No. EP-A-150365, in which the surface doping of the source region is increased to provide good contact to the subsequent metallisation. As described, the oxide layer overlying the source region is isotropically wet-etched via a window in a photoresist layer so that the oxide layer is under-etched and a contact window larger than the window in the photoresist layer is opened in the oxide layer. Using the same photoresist mask, an opening is etched, using an anisotropic plasma etching technique, through the source region to expose the body region. The doping at the exposed surface of the body region is then increased by ion implantation with the photoresist mask still in place and after removal of the photoresist mask source metallisation is deposited to short the source region to the surrounding body region. Although this method may to some extent avoid misalignment problems by using the same photoresist window to form the contact window and then to etch the source region to expose an area of the surrounding body region, the under-etching required by the method may be difficult to control and, moreover, the introduction of the impurities to increase the doping at the surface of the exposed area of the body region may burn the photoresist onto the surface, making it difficult to remove.

SUMMARY OF THE INVENTION

According to the present invention, there is provided a method of manufacturing an insulated gate field effect transistor, which method comprises providing a conductive gate layer on an insulating layer on one surface of a semiconductor body to form an insulated gate structure having a conductive gate region, introducing impurities into the semiconductor body to form a source region of one conductivity type within a body region of the opposite conductivity with part of the body region forming a channel area underlying the gate region, growing insulating material on the surface of the semiconductor body to cover the insulated gate structure, and shorting the source region to the body region by opening a contact window in the insulating layer on the one surface so as to expose a surface of the source region, providing a masking region covering the surface of the source region so as to leave an area of the source region exposed, etching away the said exposed area of the source region to expose an underlying area or areas of the body region, removing the masking region and providing metallisation within the contact window to short the exposed area of the body region to the source region, characterised by providing the masking region covering the surface of the source region so that the masking region extends completely across the contact window in one direction so that the exposed area of the source region has a periphery which is defined partly by the contact window and partly by the masking region.

Thus, with a method embodying the invention the exposed areas of the body regions may be automatically aligned to the contact windows thus avoiding or at least reducing the alignment problems of the known method discussed above and enabling devices with more reproducible characteristics to be produced.

In a method embodying the invention, the contact window may be opened by etching through an appropriate mask or the contact window may be opened by etching the insulating material anisotropically towards the surface of the semiconductor body so that insulating material remains on edges of the insulated gate structure to define the contact window.

The step of providing the masking region may comprise providing a plurality of masking regions with each extending completely across the contact window so as to define a plurality of exposed areas of the source region with each exposed area having a periphery defined partly by the contact window and partly by one or more masking regions.

The step of opening the contact windows may comprise opening an elongated contact window and the masking region, or each masking region, may be provided on the insulating layer so as to extend completely across the width of the contact window but only partly across the length of the contact window. Generally, the step of providing the masking regions comprises providing a plurality of substantially mutually parallel masking regions extending completely across the contact window but spaced-apart in the direction of the length of the contact window so as to define number of spaced-apart exposed areas of the source region within the contact window.

Each masking region may be rectangular and may extend completely across the corresponding contact window in one direction but only partially across the contact window in the direction perpendicular to the one direction, with the opening between adjacent masking regions in the perpendicular direction preferably being at least two to three times the width of the contact window in that direction.

Conveniently, the masking region(s) is(are) provided so that the exposed area or each exposed area of the source region is equal in area to the area, or each area, of the source region covered by the masking region(s).

The masking region or each masking region, may be defined by spaced apertures formed in a masking layer with the width of each aperture being larger than the width of the contact window or may be defined by a respective strip extending across the contact window or by any other suitable arrangement, it merely being necessary to ensure that in a direction transverse to the contact window the dimensions of the masking region(s) and spaces therebetween are sufficient to ensure that the masking region(s) extend(s) completely across the contact window where masking is desired and not extend across the contact window where no masking is desired even when possible misalignment tolerances are taken into account. It will be appreciated that one or more strip-like masking regions extending transversely, or in a preferred arrangement perpendicularly, of the contact window may be particularly advantageous since considerable sideways misalignment between the masking region(s) and the contact window would still not affect the positioning of the exposed areas.

The method may further comprise introducing further impurities of the opposite conductivity type through the contact window after etching to expose the underlying areas of the body region and prior to removal of the masking region(s) to increase the surface doping of the exposed body regions prior to providing metallisation in the contact window. The metallisation may be provided by depositing gold within the contact window. Thus, as the introduction of further impurities to increase the surface dopant concentration in the exposed body regions is carried out using the contact window and masking region(s) already present, gold contacts may be used without causing further alignment tolerance problems such as are caused in the known method discussed above. In a method embodying the invention, impurities may be introduced into the semiconductor body to provide a respective source region within an associated body region at each of two opposed sides of the gate region so that a part of each body region forms a respective channel area underlying the associated side of the gate region, in which case a respective contact window will be opened in the insulating layer over each source region and the masking region(s) will define with the contact windows exposed and unexposed areas of each source region. Normally the two contact windows will be formed in the same manner and of the same dimensions and the masking region(s) may extend completely across both contact windows (and over the intermediate gate region).

BRIEF DESCRIPTION OF THE DRAWINGS

In order that the invention may be more readily understood, an embodiment thereof will now be described, by way of example, with reference to the accompanying drawings, in which.

In the interests of clarity the sectional views shown in FIGS. 1, 3a to 3d, and 4 are not cross-hatched, and the FIGS. are not drawn to scale, certain dimensions, particularly thickness, having been exaggerated in the interests of clarity.

DESCRIPTION OF THE PREFERRED EMBODIMENTS

Figure 1:
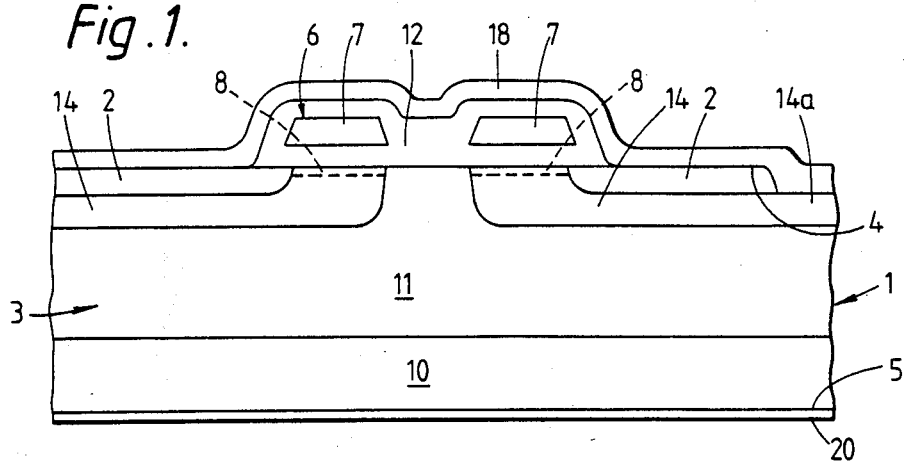
FIG. 1 shows a schematic sectional view of part of an interdigitated insulated gate field effect transistor (IGFET) manufactured by a method embodying the invention taken along the line II—II in FIG. 2.
Figure 2:
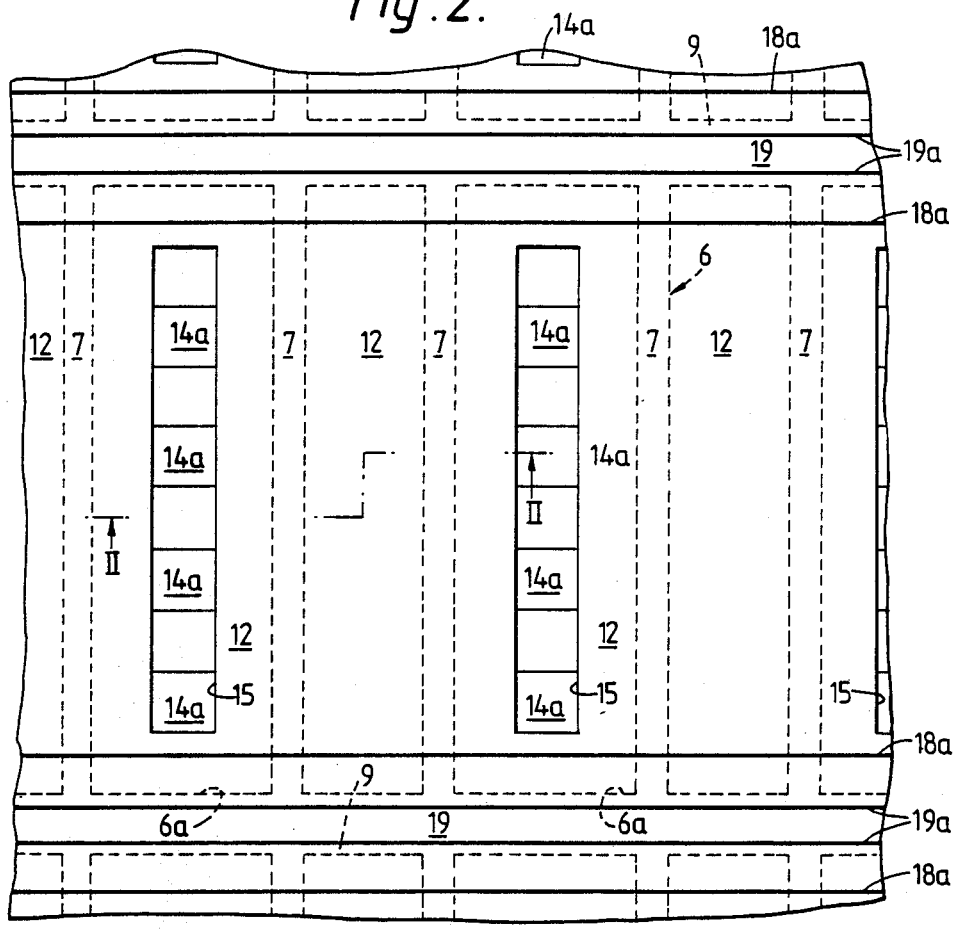
FIG. 2 is a schematic top plan view of part of the insulated gate field effect transistor shown in FIG. 1.

Referring now to FIGS. 1 and 2, there is shown an IGFET manufactured by a method embodying the invention. The IGFET shown is an interdigitated vertical DMOST suitable for use at high frequencies, for example, suitable for use at UHF frequencies, e.g. for use at approximately 1GHz (GigaHertz). The DMOST is considered to be of vertical configuration because, as shown in FIG. 1, the source and drain regions 2 and 3 of the IGFET are disposed at respective ones of two opposed major surfaces 4 and 5 of the semiconductor body 1 so that, in operation of the device, current flows vertically between the two opposed surfaces 4 and 5. A gate layer 6 of the IGFET is formed by gate fingers 7 overlying channel areas 8 of the IGFET, with the fingers 7 being interconnected by transversely extending bus bars 9. The IGFET is said to have an interdigitated structure because the gate fingers 7 are interleaved with the source regions or fingers 2. As shown in FIG. 2, the centers of the gate fingers 7 may be omitted or removed when the IGFET is intended for high frequency operation to minimize feedback capacitance between the gate and drain.

Each pair of adjacent source and drain regions 2 and 3 together with a respective channel area 8 and overlying gate finger 7 form a generally rectangular cell of the IGFET. Although not evident from FIGS. 1 and 2, the IGFET will normally consist of hundreds of such cells.

Referring now to FIGS. 3a to 3d, a method embodying the invention for manufacturing the IGFET shown in part in FIGS. 1 and 2 will now be described and further features of the IGFET should become apparent from the following description.

The semiconductor body 1 comprises an n+conductivity type substrate 10 on which is grown epitaxially a more highly resistive n conductivity type layer 11. Typically the substrate 10 may have a resistivity of $10^{-3}$ ohm cm and a thickness of 250 micrometers while the epitaxial layer 11 may have a resistivity of 1 ohm cm and a thickness of 8 micrometers.

An oxide layer 12 (FIG. 3a) is grown on the surface 4 of the layer 11 by conventional thermal techniques and a polycrystalline silicon gate layer 6 is then deposited on the oxide layer 12. Using conventional masking and etching techniques unwanted parts of the gate layer 6 are removed so as to form the gate fingers 7 interconnected by the bus bars 9 (FIG. 2). The gate layer 6 thus has a mesh-like structure defining rectangular openings 6a arranged in a rectangular array. The centers of the gate fingers 7 are not removed at this stage.

The gate layer 6 may be deposited as a doped polycrystalline silicon layer or the gate fingers may be formed using a method such as that described in the above-mentioned European Patent No. EP-A-67475, corresponding to U.S. Pat. No. 4,466,175.

Further by a method described in European Patent No. EP-A-67475, corresponding to U.S. Pat. No. 4,466,175, a polycrystalline silicon layer having a relatively high resistivity, for example $10^5$ ohm cm, is deposited on the oxide layer 12 followed by a silicon nitride layer (not shown) and a silicon nitride masking layer 13. The polycrystalline silicon layer is then etched in the presence of the masking layer to leave the desired rectangular mesh configuration for the gate layer 6. A doping element such as boron is then diffused into the remaining gate layer via the exposed edges thereof so as to form relatively low resistivity gate strips (not shown) in and running parallel to the edges of the rectangular mesh configuration. As described in European Patent No. EP-A-67475, corresponding to U.S. Pat. No. 4,466,175, the bus bars 9 may be formed in a similar manner and may be later overlaid with metal strips 19, for example aluminum, to lower the resistivity of the bus bars. The use of such a method has the advantage of enabling the center portion of each gate finger 7 to be maintained as the central portion is relatively high resistivity material which may provide effective decoupling between the highly doped gate strips and the drain.

Of course, the gate layer 6 used to form the gate fingers 7 and the bus bars 9 need not necessarily be formed by a doped polycrystalline silicon layer but may be formed from any suitable conductive material, for example metal, a metal silicide, or a combination of polycrytstalline silicon and metal silicide.

Figure 3A:
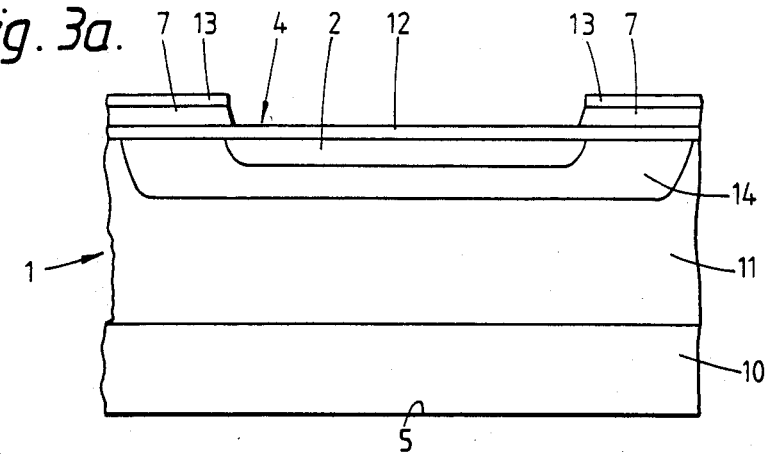
FIGS. 3a, 3b, 3c and 3d illustrate various stages of a method embodying the invention for manufacturing the IGFET shown in FIGS. 1 and 2.
Figure 3B:
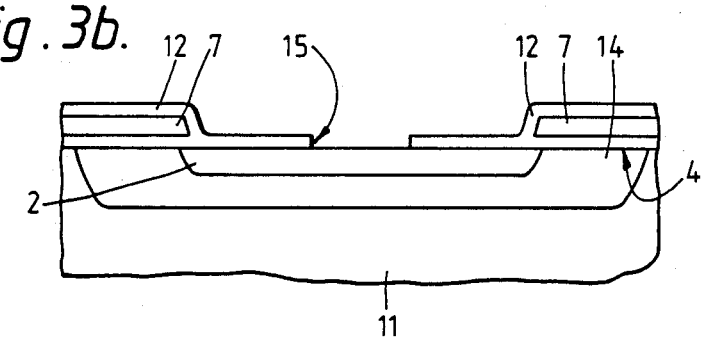

Still referring to FIG. 3a, with the masking layer 13 still in place over the gate fingers 7, boron ions are implanted using, for example, a dose of $10^{13}cm^{-2}$ and an energy of 150keV followed by a drive-in at 1050 degrees Celsius for 30 minutes so as to form p-type body regions 14 within the layer 3, areas of the p-type body regions 14 underlying the gate fingers forming the channel areas 8 of the eventual IGFET. A second implantation step through the gate layer 6 but using phosphorous ions at an energy of 50keV and a dose of $10^{15}cm^{-2}$ is then carried out followed by an annealing step, for example of 10 minutes at 1000 degrees Celsius, to form the source regions or fingers 2. With the above-mentioned conditions, the p-type impurities diffuse laterally further than the n-type impurities so that the length of channel area 8 is determined by the difference in the lateral diffusion lengths of the n and p-type dopants.

Having thus formed the source and body regions 2 and 14, further oxide is deposited over the entire major surface 4 and elongated rectangular contact windows 15 (FIG. 3b) are opened in the oxide layer 12 using conventional masking and etching techniques with each contact window 15 being disposed within a respective rectangular opening 6a of the mesh like gate layer 6, so as to expose part of the surface of each source region 2. At the same time further contact windows 9a (FIG. 3d) are opened in the oxide layer 12 to enable contact to be made to the bus bars 9 as will be described hereinafter.

A suitable resist layer 16 is then applied (FIGS. 3c and 3d) to the surface of the oxide 12 and is patterned using conventional techniques to define apertures 17 in the resist layer so that masking regions 16a of the resist layer 16 extend completely across the contact windows.

Each contact window 15 is associated with one or more masking regions 16a so that the contact window and masking region(s) 16a together define one or more exposed areas 2a of the associated source region 2, that is areas 2a of the source region 2 not covered by either the masking region(s) or the oxide layer 12 within which the contact window 15 is defined. The exposed area(s) 2a within each contact window 15 are thus not defined merely by the masking region(s) 6a but by the combination of the masking region(s) 16a and the contact window 15. As shown, the masking region(s) 16a define(s) one dimension of the exposed area(s) 2a and the contact window 15 defines the other dimension of the exposed area(s) 2a.

Although any desired suitable shape could be used for the apertures 17, as shown each aperture 17 is rectangular. The dimension or width of each aperture 17 in a direction transverse (in the example shown, perpendicular) to the length of the associated contact window 15 is greater, usually by at least two times the maximum misalignment error which could occur, than the width of the contact window 15 so that, even when possible misalignment errors are taken into account, edges 17a of the apertures 17 extending longitudinally of the associated contact window 15 do not overlap the elongate edges 15a of the contact window. The width of the contact windows 15 may be 3 micrometers while the width of the apertures 17 may be 9 micrometers.

Alternatively, the resist layer 16 may be formed as a series of discrete strips extending transversely, in the example shown perpendicularly, of the contact windows 15 so as to reduce even further the possibility of the resist layer overlapping the longitudinal edges of the contact window except in places where the resist layer extends completely across the contact windows.

Thus, the resist layer 16 only covers the parts of the contact windows which it is desired to mask and where the resist layer so covers part of a contact window 15 the resist layer extends completely across the width of the contact window 15. The resist layer should extend transversely beyond the contact window on each side for a distance equal to at least the maximum tolerance error which could be expected.

Within each contact window 15, the relative sizes of the exposed source areas 2a and the source areas 2b covered by the resist masking regions 16a may be in any desired ratio. Preferably, the total area of exposed source surface 2a within each contact window 15 equals the total area of covered source surface 2b within each contact window 15. The sizes of the respective individual exposed and covered areas 2a and 2b may be equal. In the arrangement shown, the resist layer 16 is selected so as to provide alternate exposed and covered equal area square areas 2a and 2b of the source region. Where the contact windows 15 are 3 micrometers wide, then the areas 2a and 2b may be 3 micrometers square. It should of course be appreciated that the exposed and covered areas 2a and 2b may have any desired shape. The number of exposed and covered areas will depend upon the particular device and the length of the gate fingers, the latter being determined by the desired gate RC time constant. As shown four exposed areas 2a and four covered areas 2b are provided in each contact window 15.

Figure 3C:
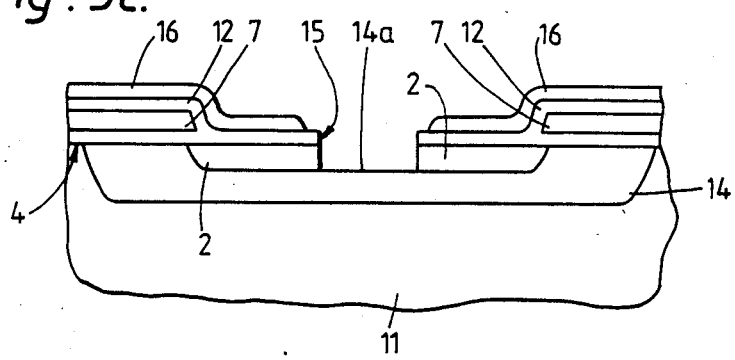
Figure 3D:
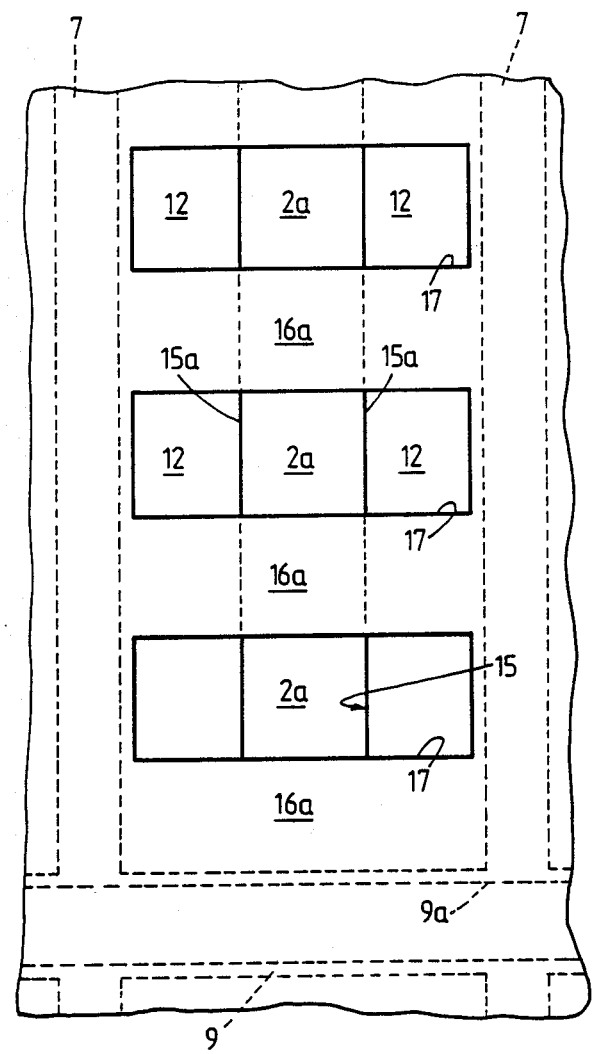

Using conventional etching processes the exposed areas 2a of the source regions are then removed so as to expose the underlying areas 14a of the p-type body regions 14, see FIG. 3c. The resist layer 16 is then removed and metal is deposited over the surface of the semiconductor body. Using known resist masking and etching techniques separate source metallisation 18 and bus bar metallisation 19 are defined. Although in the interests of clarity the source metallisation 18 is omitted in FIG. 2, the edges of the source metallisation 18 which of course extends over the contact windows 15 is illustrated by the thick lines 18a in FIG. 2, the edges of the bus bar metallisation 19 similarly being defined by the thick lines 19a. The source metallisation 18 thus shorts the exposed p body regions to the exposed source regions 2a within each contact window 15.

Where the source metallisation 18 is to be aluminum, then the aluminum may be deposited by conventional means directly on the surface of the semiconductor device after exposing the underlying areas 14a of the body regions 14 as mentioned above. If, however, gold contacts are to be used, the exposed underlying areas 14a of the body regions 14 are subjected to a further boron ion implantation step before removal of the resist layer 16 to increase the doping at the exposed surface of the p body areas 14a so as to improve electrical contact between the p body areas 14a and the later deposited gold. As the resist layer 16 is used as the mask for the further boron ion implantation step no additional masking stages are required.

The drain of the transistor is formed by the n-type substrate 10 and an electrode 20 is provided on the free surface 5 of the substrate 10 to form the drain contact. The electrode may be, for example, gold-antimony which is deposited in a known manner.

Figure 4:
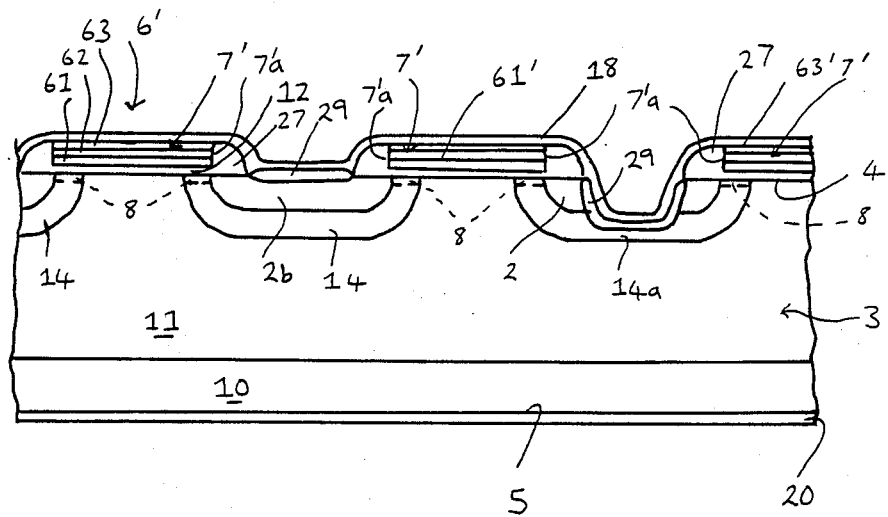
FIG. 4 shows a schematic sectional view of part of an interdigitated insulated gate field effect transistor (IGFET) manufactured by a modified method embodying the invention.

Referring now to FIG. 4, there is illustrated schematically and in cross-section part of a modified form of the IGFET described above with like or similar features being denoted by like or similar reference numerals.

The modified IGFET is similar to that shown in FIG. 1 with the exception that the IGFET shown in FIG. 4 has a gate structure with a composite conductive gate layer 6' defining composite conductive solid gate fingers 7'.

In this particular example, a polycrystalline silicon layer 61 is deposited on the oxide layer 12 followed by an insulating layer 62, for example, a silicon dioxide layer, and then an etch-resistant layer 63 of, for example, silicon nitride. Using conventional masking and etching techniques unwanted parts of the composite gate layer 6' are removed so as to form the gate fingers 7' interconnected by the bus bars 9 (FIGS. 2 and 3).

In order to provide the required low resistivity, the polycrystalline silicon gate layer 61 is doped with, for example, boron or phosphorus. Although the layer 61 may be deposited as a doped layer, doping may be carried out after deposition and patterning of the gate layer 6'. For example, the doping of the gate layer 6' may occur during formation of the source and body regions 2 and 14 or may be by lateral diffusion of, for example, boron into exposed edges of the patterned gate layer as described in European Patent No. EP-A-67475, corresponding to U.S. Pat. No. 4,466,175.

Of course, the gate layer 61 need not necessarily be a polycrystalline silicon layer but could be any suitable conductive layer, for example, a refractory metal layer, a refractory metal silicide layer (for example, a platinum silicide layer) deposited on the oxide layer 12, or a composite of two or more of the above mentioned materials.

In the manufacture of the IGFET shown in FIG. 4, after the gate layer 6' has been formed, insulating material 12', for example silicon dioxide, is deposited on the surface 4 by an appropriate vapor deposition technique. The insulating material grows on all exposed surface, that is the surface 4, where exposed, the surface 63' of the gate layer and edges 9a (FIG. 3d) and 7'a of the gate layer 6'.

When the growth of the insulating material is stopped, the insulating material is etched anisotropically toward the surface 4 using, for example, a reactive ion etching technique using, for example, a CHF$_3$ and Argon gas mixture to expose the surface 4 beneath the apertures in the gate layer 6' and the surface 63' of the composite gate layer 6'. As the anisotropic etching attacks the insulating material in a direction normal to the surface 4, a given vertical thickness of insulating material is removed. Thus when the surface 4 within the apertures in the gate layer defined between the gate fingers 7' and bus bars 9 and the surface 63' of the gate layer 6' are exposed by the anisotropic etching, fillets 27 of insulating material of the original laterally grown thickness remain on the edges 9a, 7'a of the gate layer 6' so defining a respective contact window (similar to the contact window 15) in the insulating material disposed above and within each aperture in the gate layer 6'.

Impurities are then introduced into the semiconductor body, for example by ion implantation as described above with reference to FIGS. 1 to 3d, via the contact windows to form the body regions 14 and source regions 2.

After formation of the source and body regions 2 and 14, the resist layer 16 is applied to the surface of the insulating material and is patterned using conventional techniques to define the apertures 17 in the resist layer so that masking regions 16a of the resist layer 16 extend completely across the windows in the insulating material.

Each contact window 15 is, as in the example described with reference to FIGS. 1 to 3d, associated with one or more masking regions 16a so that the window 15 and associated masking region(s) 16a together define one or more exposed areas 2a of the associated source region 2, that is areas 2a of the source region 2 not covered by either the masking region(s) or the insulating material within which the window is defined. The exposed area(s) 2a within each contact window 15 are thus, as in the example described with reference to FIGS. 1 to 3d, not defined merely by the masking region(s) 16a but by the combination of the masking region(s) 16a and the windows 15 so that, as in the FIGS. 1 to 3d embodiment, part of the periphery of each exposed area 2a is defined by the masking regions 16a and part by the contact window. As shown, the masking region(s) 16a define(s) one dimension of the exposed area(s) 2a and the contact window defines the other dimension of the exposed area(s) 2a.

As in the case of the example described with reference to FIGS. 1 to 3d, although any desired suitable shape could be used for the apertures 17, as shown each aperture 17 is rectangular to fit with the rectangular pattern adopted for the windows and gate layer 6'. The dimension or width of each aperture 17 in a direction transverse (in the example shown, perpendicular) to the length of the associated window is greater, usually by at least two times the maximum misalignment error which could occur, than the width of the contact window so that, even when possible misalignment errors are taken into account, edges 17a of the apertures 17 extending longitudinally of the associated contact window do not lie inside the elongate edges of the window. Alternatively, the resist layer 16 may be formed as a series of discrete strips extending transversely, in the example shown perpendicularly, of the windows so as to reduce even further the possibility of the resist layer overlapping the longitudinal edges of the contact window except in places where the resist layer extends completely across the contact windows.

Thus, the resist layer 16 only covers the parts of the windows which it is desired to mask and where the resist layer does cover part of a window the resist layer extends completely across the width of the window. The resist layer should extend transversely beyond the contact window on each side for a distance equal to at least the maximum tolerance error which could be expected.

Within each contact window 15, the relative sizes of the exposed source areas 2a and the unexposed source areas 2b covered by the resist masking regions 16a may be in any desired ratio. In the arrangement shown, the resist layer 16 is selected so as to provide alternate exposed and covered equal area areas 2a and 2b of the source region. It should of course be appreciated that the exposed and covered areas 2a and 2b may have any desired shape. The number of exposed and covered areas will depend upon the particular device and the length of the gate fingers 7', the latter being determined by the desired gate RC time constant.

Using conventional etching processes the exposed areas 2a of the source regions are then removed so as to expose the underlying areas 14a of the p-type body regions 14. The resist layer 16 is then removed.

After formation of the source and drain regions 2 and 14 and exposure of the body areas 14a as described above, a refractory metal silicide layer 29 may be formed on the exposed areas of the surface 4 of the silicon body. The gate layer 61 may also be exposed using an appropriate etchant to remove the silicon nitride layer 63 and insulating layer 62 for subsequent silicidation. In such an arrangement it would also be necessary to provide fresh insulating material over the silicided gate layer to prevent shorting to, and to reduce the capacitance with the subsequent source metallisation 18. The metal silicide layer 29 may be formed in a known manner by depositing a refractory metal, for example tungsten, molybdenum, platinum or titanium, on the semiconductor body and then annealing, for example, thermally or by use of a laser beam so as to form refractory metal silicide only over the exposed areas of the silicon surfaces. Metal remaining on the insulating material is removed by an appropriate method, for example, an acid treatment. The source, gate and drain metallisation 18, 19, 20 is then deposited as described above with reference to FIGS. 1 to 3d.

Of course, the invention is applicable to IGFETs made of a semiconductor material other than silicon and to IGFETs where the source and drain regions are formed in a different manner from that described above. Also, although the invention finds particular application in relation to interdigitated structures it may be applicable in relation to other cellular structures. As will be appreciated, the conductivity types of the various regions of the IGFET described above could be reversed.

From reading the present disclosure, other modifications will be apparent to persons skilled in the art. Such modifications may involve other features which are already known in the design of semiconductor devices and which may be used instead of or in addition to features already described herein. Although claims have been formulated in the application to particular combinations of features, it should be understood that the scope of the disclosure of the present application also includes any novel feature or any novel combination of features disclosed herein either explicitly or implicitly or any generalization or modification of one or more of those features Which would be obvious to persons skilled in the art, whether or no it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A method of manufacturing an insulated gate field effect transistor comprising the steps of
   providing an insulating layer on one surface of a semiconductor body, said semiconductor body being of a first conductivity type;
   providing a conductive gate layer on at least portions of said insulating layer to form an insulated gate structure having at least one conductive gate region;
   introducing impurities into said semiconductor body through said insulating layer in areas adjacent said insulative gate structure to form at least one source region at said one surface within at least one body region of said semiconductor body, said source region being of a second conductivity type opposite to said first conductivity type;
   forming at least one channel region below said gate region;
   covering said insulated gate structure with another insulating layer by growing insulating material on said one surface of said semiconductor body;
   opening at least one contact window in said another insulating layer to said one surface to expose a surface of said source region,
   providing a resist layer on said another insulating layer, and patterning said resist layer to form a plurality of masking regions on said one surface over at least a portion of said source region, said masking regions extending completely across said contact window in a first direction, and said masking regions only partly covering said contact window in a second direction, said source region having at least one exposed portion defined partially by said contact window and partially by said masking regions;
   etching away said exposed portion of said source region to expose underlying portions of said body region;
   removing said masking regions; and
   providing metallisation within said contact window to short said exposed underlying portions of said body region to said source region.

2. A method according to claim 1, wherein said step of opening said contact window is carried out by anisotropically etching said another insulating layer toward said one surface of said semiconductor body, said another insulating layer remaining at edges of said insulated gate structure to define said contact window.

3. A method according to claim 1 or claim 2, wherein said masking region are provided by forming a plurality of masking areas completely across said contact window in said first direction, said plurality of masking areas being separated in said second direction to form a plurality of said exposed portions of said source region, and wherein each of said plurality of said exposed portions has a periphery defined partly by said contact window and partly by one or more of said plurality of masking areas.

4. A method according to claim 3, wherein said step of opening said contact window is carried out by opening an elongated contact window extending in said second direction, said plurality of masking areas extending completely across a width of said elongated contact window in said first direction, and said plurality of masking areas extending only across portions of a length of said elongated contact window in said second direction.

5. A method according to claim 4, wherein said plurality of masking areas are formed substantially mutually parallel across said elongated contact window in said first direction, wherein said plurality of masking areas are formed spaced apart in said second direction, and wherein a number of spaced apart exposed portions of said source region are provided within said elongated contact window.

6. A method according to claim 5, wherein said plurality of masking areas are formed equally spaced apart in said second direction.

7. A method according to claim 5, wherein said number of spaced apart exposed portions of said source region are formed with a first area, said first area being equal to a second area of said plurality of masking areas covering said source region.

8. A method according to claim 4, wherein said plurality of masking areas are formed by apertures in said masking region, and wherein each of said apertures is formed with a width dimension larger than said width of said elongated contact window.

9. A method according to claim 4, further comprising, between said steps of etching away and removing, the further step of introducing further impurities of said first conductivity type through said contact window, said further impurities increasing surface doping of the exposed underlying portions of said body region.

10. A method according to claim 4, wherein said step of introducing impurities is carried out at opposite sides of said gate regions to form respective source regions in associated body regions at each of said opposite sides, said associated body regions forming respective ones of said channel regions under said opposite sides of said gate region, and wherein each of said respective source regions is shorted to said associated body region, respective ones of said contact windows being opened over each of said source regions.

11. A method according to claims 1 or 2, wherein said step of opening said contact window is carried out by opening an elongated contact window extending in said second direction, wherein a plurality of masking areas extend completely across a width of said elongated contact window in said first direction, said plurality of masking areas extending only across portions of a length of said elongated contact window in said second direction.

12. A method according to claim 11, wherein said plurality of masking areas are formed substantially mutually parallel across said elongated contact window in said first direction, wherein said plurality of masking areas are formed spaced apart in said second direction, and wherein a number of spaced apart exposed portions of said source region are provided within said elongated contact window.

13. A method according to claim 12, wherein said plurality of masking areas are formed equally spaced apart in said second direction.

14. A method according to claim 12, wherein said number of spaced apart exposed portions of said source region are formed with a first area, said first area being equal to a second area of said plurality of masking areas covering said source region.

15. A method according to claim 11, wherein said plurality of masking areas are formed by apertures in said masking region, and wherein each of said apertures is formed with a width dimension larger than said width of said elongated contact window.

16. A method according to claim 1 or 2, further comprising, between said steps of etching away and removing, the further step of introducing further impurities of said first conductivity type through said contact window, said further impurities increasing surface doping of the exposed underlying portions of said body region.

17. A method according to claim 1 or 2, wherein said step of introducing impurities is carried out at opposite sides of said gate regions to form respective source regions in associated body regions at each of said opposite sides, said associated body regions forming respective ones of said channel regions under said opposite sides of said gate region, and wherein each of said respective source regions is shorted to said associated body region, respective ones of said contact windows being opened over each of said source regions.

* * * * *